(12) United States Patent
Neidorff et al.

(10) Patent No.: US 11,614,368 B2
(45) Date of Patent: Mar. 28, 2023

(54) METHODS AND APPARATUS TO PROVIDE AN ADAPTIVE GATE DRIVER FOR SWITCHING DEVICES

(71) Applicant: Texas Instruments Incorporated, Dallas, TX (US)

(72) Inventors: Robert Allan Neidorff, Bedford, NH (US); Saurav Bandyopadhyay, Dallas, TX (US); Thomas Matthew LaBella, Raleigh, NC (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/050,949

(22) Filed: Jul. 31, 2018

(65) Prior Publication Data

US 2020/0041356 A1 Feb. 6, 2020

(51) Int. Cl.
*G01K 7/01* (2006.01)
*H03K 17/14* (2006.01)
*G01K 13/00* (2021.01)

(52) U.S. Cl.
CPC .............. *G01K 7/01* (2013.01); *G01K 13/00* (2013.01); *H03K 17/145* (2013.01)

(58) Field of Classification Search
CPC ......... G01K 7/01; G01K 13/00; H03K 17/145
See application file for complete search history.

(56) References Cited

U.S. PATENT DOCUMENTS

| | | | | |
|---|---|---|---|---|
| 4,808,847 A * | 2/1989 | Van Kessel | ............. | G05F 3/245 330/288 |
| 5,095,227 A * | 3/1992 | Jeong | ........................ | G01K 7/01 374/185 |
| 6,373,296 B1 * | 4/2002 | Auer | ..................... | H03K 17/163 327/108 |
| 8,203,315 B2 * | 6/2012 | Ladumer | ............ | H03K 17/0822 320/150 |
| 8,392,132 B2 * | 3/2013 | Lin | ..................... | G01R 31/2837 702/64 |
| 8,985,850 B1 * | 3/2015 | Godbole | ................ | G01K 13/00 327/513 |
| 10,547,273 B2 * | 1/2020 | Rachala | ................. | H03K 3/011 |

(Continued)

FOREIGN PATENT DOCUMENTS

| | | |
|---|---|---|
| RU | 112540 | 1/2012 |
| RU | 2656866 C1 | 6/2018 |

OTHER PUBLICATIONS

Search Report for PCT Application No. PCT/US19/43446, dated Oct. 31, 2019, 1 page.

*Primary Examiner* — Ryan Johnson
*Assistant Examiner* — Colleen J O Toole
(74) *Attorney, Agent, or Firm* — Ray A. King; Frank D. Cimino

(57) ABSTRACT

Methods and apparatus to provide an adaptive gate driver for switching devices are disclosed. An example apparatus includes an electrical switch to drive an electrical system; a condition characterizer to select a drive strength based on a first system parameter corresponding to the electrical system, the first system parameter including at least one of an input voltage corresponding to the electrical switch, an output current corresponding to the electrical switch, or a process variation of the electrical switch; and a driver to generate an output having a current corresponding to the selected drive strength.

19 Claims, 6 Drawing Sheets

(56) References Cited

U.S. PATENT DOCUMENTS

| | | | |
|---|---|---|---|
| 2009/0160490 A1* | 6/2009 | Choi | H03M 1/08 |
| | | | 327/51 |
| 2014/0077864 A1* | 3/2014 | Bianchi | G05F 3/245 |
| | | | 327/512 |
| 2016/0164397 A1 | 6/2016 | Kong et al. | |
| 2017/0373676 A1* | 12/2017 | Kaeriyama | H03K 17/0406 |
| 2018/0062633 A1 | 3/2018 | Nomura | |

* cited by examiner

METHODS AND APPARATUS TO PROVIDE AN ADAPTIVE GATE DRIVER FOR SWITCHING DEVICES

FIELD OF THE DISCLOSURE

This disclosure relates generally to drivers for switching devices and, more particularly, to methods and apparatus to provide an adaptive gate driver for switching devices.

BACKGROUND

A power converter is a circuit that is used in various devices to convert an input voltage to a desired output voltage. For example, a buck converter converts an input voltage into a lower output voltage by controlling transistors and/or switches to charge and/or discharge inductors and/or capacitors to maintain the desired output voltage. Power converters may include one or more power switches that may be used to change the path of current in the power converters. A driver may be used to enable the power switch(es). To increase the efficiency of such a power converter, the drive strength of the driver may be increased to decrease the amount of time it takes to switch the power switch (e.g., from off to on).

SUMMARY

Certain examples disclosed herein provide an adaptive gate driver for switching devices. An example apparatus includes an electrical switch to drive an electrical system; a condition characterizer to select a drive strength based on a first system parameter corresponding to the electrical system, the first system parameter including at least one of an input voltage corresponding to the electrical switch, an output current corresponding to the electrical switch, or a process variation of the electrical switch; and a driver to generate an output having a current corresponding to the selected drive strength.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1:
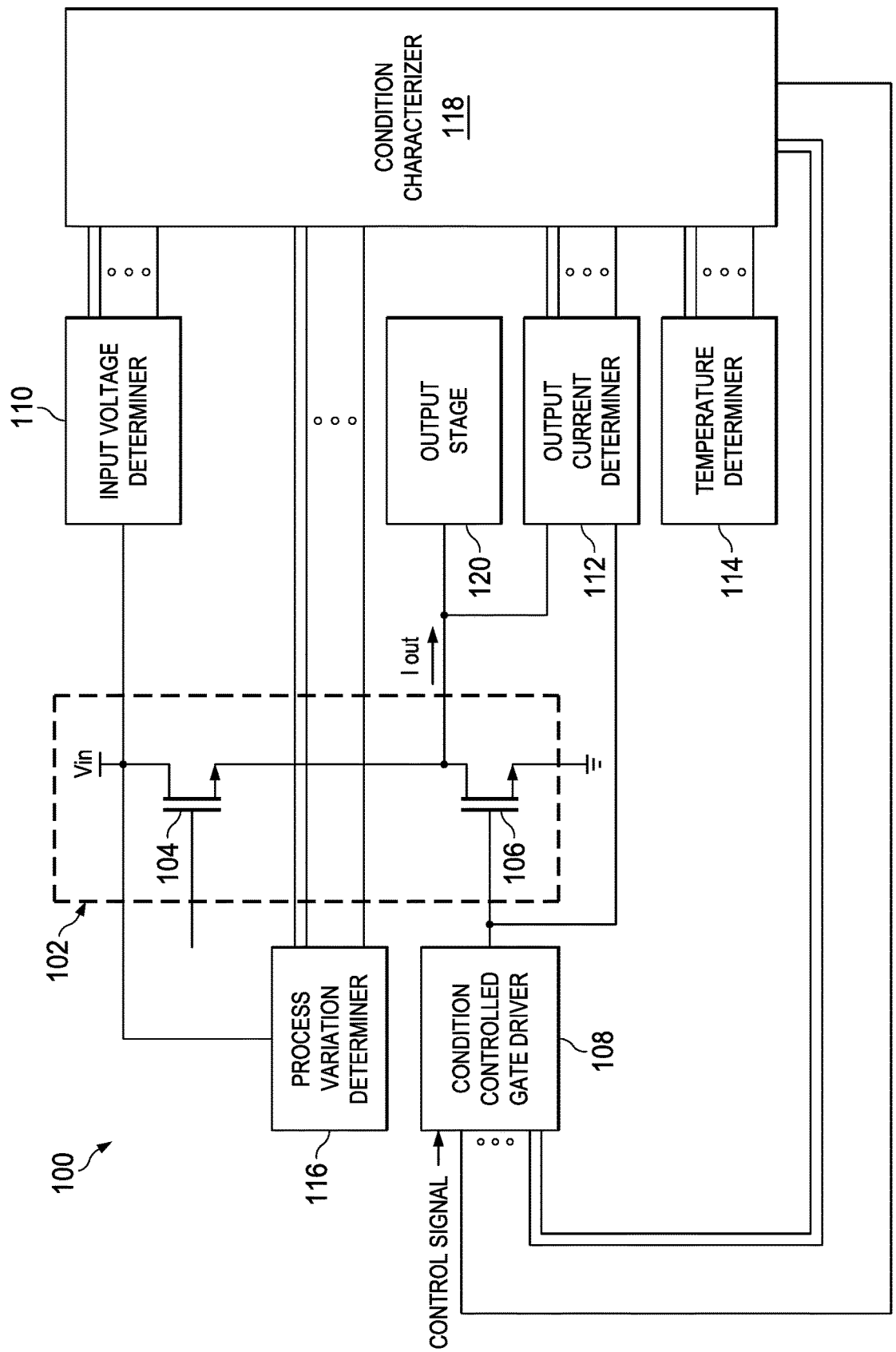
FIG. 1 is an illustration of an example adaptive gate drive circuit.

Power converters (e.g., buck converters., boost converters, AC-AC converters, DC-DC converters, AC-DC converters, etc.) may include power switches (e.g., relays, MOSFETs, etc.) that switch currents from one path to another. Such systems have series inductance (e.g., in every wire) and stray capacitance (e.g., in every piece of metal). Thus, the inductance and/or capacitance of such systems may cause undesired voltage spikes and/or ringing during current path switching. If the voltage spike is large enough (e.g., above the breakdown voltage of the gate oxide of a transistor), gate oxide breakdown can occur at the gate of the transistor. If the inductance stores sufficient energy, gate oxide breakdown can damage the system by breaking down the gate oxide of the transistor. The switching speed corresponds to the efficiency of a power converter and contributes to the magnitude of voltage spikes (e.g., the faster the switching speed the more efficient the system, but the higher the voltage spike). In MOSFET based power converters, the switching speed corresponds to the amount of time necessary to turn on the MOSFET (e.g., a fast switching speed means less time to turn on a MOSFET when a voltage is applied to the gate of the MOSFET). To adjust the switching speed, the strength of a driver (e.g., a ratio between an amount of current the driver conducts over a voltage at an output of the driver) which drives the gate of a MOSFET may be adjusted. For example, a higher drive strength may be used for fast switching of the MOSFET, while a lower drive strength may be used for slower switching of the MOSFET. Examples disclosed herein provide an adaptive gate driver for a switching device (e.g., a MOSFET) to increase switch speed (e.g., to increase efficiency), while avoiding voltage spikes above a gate oxide breakdown voltage (e.g., the voltage at which the oxide at the gate of the transistor breaks down) of the switching device. Examples disclosed herein utilize characteristics (e.g., input voltage, output current, temperature, and/or process variation) of an electrical system to control the drive strength of the gate driver to balance the switching speed with the voltage spike magnitudes corresponding to a high efficient power converter.

Some techniques to increase switching speed of a power switch of a power converter include utilizing high-voltage FETs to drive switching components. However, such high-voltage FETs are more expensive, larger, and less efficient than lower-voltage FETs. Other techniques include reducing switching speed of switching converters to avoid voltage spikes above or near the gate oxide breakdown voltage of the switching components. However, as described above, slowing the switching speed reduces efficiency. Examples disclosed herein utilize the characteristics of the electrical system/switching device to adjust drive strength dynamically to drive the switching components at the fastest speed based on a variety of measurement/characteristics, while ensuring that the voltage spikes will not result in gate oxide breakdown of the switching component(s).

The characteristics/parameters of an electrical system (e.g., a power converter) affect the switching speed and/or magnitude of voltage spikes associated with the switching speed. For example, the silicon temperature, input voltage, output current and/or process variation are characteristics/parameters that affect the switching speed and/or magnitude of the voltage spike. Accordingly, examples disclosed herein adjust the drive strength for power switches based on the silicon temperature, input voltage, output current and/or process variation to correspond to a fast switching speed that will not cause gate oxide breakdown in a switching device (e.g., a power switch). At a higher load current, there is more stored energy in circuit inductances, causing overshoot and ringing amplitude to be higher. At a higher input voltage, it will take a lessor overshoot current to cause the peak voltage to reach a gate oxide breakdown voltage of the switching device.

Accordingly, examples disclosed herein may control (e.g., select) the driver strength (e.g., the to increase the driver strength at lower load currents and/or input voltages and decrease the driver strength at higher load currents and/or higher input voltages. Additionally, at a lower silicon temperature, switching devices are faster (e.g., the amount of time it takes to turn on/off the transistor with the same amount of voltage/current is faster because the carrier has higher mobility) and have lower gate oxide breakdown voltage, whereas at higher silicon temperatures, switching devices are slower (e.g., the amount of time it takes to turn/off the transistor with the same amount of voltage/current is slower because the carrier has lower mobility) and higher gate oxide breakdown voltage. Accordingly, examples disclosed herein may control the driver to reduce the driver strength at lower temperatures and increase the driver strength at higher temperatures. Additionally, switching components have some amount of process variation during production of the components that can correspond to different switching speeds and/or voltage spike magnitudes. For example, process variation can cause different gate oxide thicknesses that affect the switching speed and voltage spike magnitudes. Accordingly, examples disclosed herein may control the drive strength of a driver based on measured process variation outputs. Using examples disclosed herein, power converters and/or other switching circuits may be controlled by different drive strengths dynamically corresponding to measured conditions to ensure a fast switching rate without the threat of gate oxide breakdown.

FIG. 1 illustrates an example adaptive gate drive circuit 100. The adaptive gate drive circuit 100 includes an example power stage 102 including example transistors 104, 106. The adaptive gate drive circuit 100 further includes an example condition controlled gate driver 108, an example output current determiner 112, an example temperature determiner 114, an example process variation determiner 116, an example condition characterizer 118, and an example output stage 120. Although the adaptive drive circuit 100 is described to drive the gate of the transistor 106, the adaptive drive circuit 100 may be used to drive any type of power switch (e.g., the transistor 104, a transistor of a different type of converter, a relay driver, and/or any type of power switch).

Although FIG. 1 corresponds to the condition controlled gate driver 108 adjusting drive strength based on the output of the input voltage determiner 110, the output current determiner 112, the temperature determiner 114, and/or the process variation determiner 116, FIG. 1 may be adjusted to include any one, or combination of the input voltage determiner 110, the output current determiner 112, the temperature determiner 114, and the process variation determiner 116. In such examples, the condition controlled gate driver 108 may adjust drive strength based on the output of the utilized components.

The power stage 102 of FIG. 1 includes electrical switches (e.g., power switches) represented by the transistors 104, 106. The transistors 104, 106 may be MOSFETs (e.g., p-channel and/or n-channel), power FETs, etc. In some examples, the transistors 104, 106 are toggled to allow the output current (Iout) to flow toward the output stage 120 or toward ground, depending on the state of the transistors 104, 106. For example, when the first transistor 104 is enabled and the second transistor 106 is disabled, the input voltage is shorted to the output stage 120 via the first transistor 104, causing the output current to flow toward the output stage 120. The output stage 120 may include components (e.g., capacitors, inductors, etc.) that, when driven by the power stage 102 convert the input voltage (Vin) to a desired output voltage. When the first transistor 104 is disabled and the second transistor 106 is enabled, the output current flows out from ground via the second transistor 106. Accordingly, one or more control signals may be applied to the gates of the transistors 104, 106 to switch the flow of current to convert an input voltage to a desired output voltage (e.g., such as in a power converter).

The condition controlled gate driver 108 of FIG. 1 outputs a current/voltage to drive the gate of the transistor 106 to enable the transistor 106. The stronger the drive strength (e.g., the higher the ratio between an amount of current the driver conducts over a voltage at an output of the driver) of the condition controlled gate driver 108, the faster the transistor 106 will turn/switch on and off. The faster the switching, the more efficient the power stage 102 is. However, as described above, the faster the switching, the larger the magnitude of a voltage spike caused by series inductance and/or stray capacitance in the power stage 102. If the voltage spike is large enough, the voltage from drain to source of transistor 106 may be above the gate oxide breakdown voltage of the transistor 106, which may cause damage to the transistor 106 by breaking down the gate oxide layer of the transistor 106. Accordingly, the condition controlled gate driver 108 is implemented as a condition controlled driver that adjusts the drive strength dynamically based on one or more conditions of the power stage 102 during operation of the power stage 102. The one or more conditions are input voltage, output current, silicon temperature, and/or process variation. Accordingly, the condition controlled gate driver 108 changes its drive strength to ensure a fast switching time while avoiding a voltage spike that can cause gate oxide breakdown in the transistor 106. The condition controlled gate driver 108 drives the gate of the transistor 106 by generating an output signal having a current corresponding to the selected strength (e.g., stronger drive strength corresponding to more current at the output of the driver 108 and a lower drive strength corresponding to less current at the output of the driver 108). The condition controlled gate driver 108 outputs a voltage pulse width (e.g., corresponding to condition dependent drive strength) based on a received control signal corresponding to a timing protocol to achieve a desired output voltage at the output stage 120.

The input voltage determiner 110 of FIG. 1 measures the input voltage (Vin) of the power stage 102. For example, the input voltage determiner 110 may be a sensor (e.g., a voltage sensor). Additionally or alternatively, the input voltage determiner 110 may be a circuit configured to determine a voltage at a node. In some examples, the input voltage determiner 110 outputs a single output signal that corresponds to the measured voltage. In some examples, the input voltage determiner 110 outputs multiple output signals, each corresponding to a comparison with one or more thresholds each corresponding to different voltages, as further described below in conjunction with FIG. 2. As described above, when the input voltage is high, it will take a lessor overshoot to cause the peak voltage to reach a gate oxide breakdown voltage. Accordingly, the drive strength of the condition controlled gate driver 108 should be lower when the input voltage is high to avoid voltage peaks above the gate oxide breakdown voltage and higher when the input voltage is lower to increase the switching speed for higher efficiency. A circuit-based example of the input voltage determiner 110 is further described below in conjunction with FIG. 2.

The output current determiner 112 of FIG. 1 measures the output current (Iout) of the example power stage 102. For example, the output current determiner 112 may be a sensor (e.g., a current sensor, a transimpedance sensor, a voltage sensor corresponding to a current, etc.). Additionally or alternatively, the output current determiner 112 may be a circuit configured to determine a current. In some examples, the output current determiner 112 outputs a single output signal that corresponds to the measured current (e.g., a voltage that corresponds to the output current). In some examples, the output current determiner 112 outputs multiple output signals, each corresponding to a comparison with one or more thresholds corresponding to different current amounts, as further described below in conjunction with FIG. 2. As described above, when the input current is high, there is more stored energy in stray inductances, so overshoot is higher. Accordingly, the drive strength of the condition controlled gate driver 108 should be lower when the input current is high to avoid voltage peaks above the gate oxide breakdown voltage and higher when the input current is lower to increase the switching speed for higher efficiency. A circuit-based example of the output current determiner 112 is further described below in conjunction with FIG. 2.

The temperature determiner 114 of FIG. 1 measures the silicon temperature of the power stage 102. For example, the temperature determiner 114 may be a sensor (e.g., a temperature sensor, a kT/q thermometer, a silicon bandgap temperature sensor, a thermistor based sensor, etc.). Additionally or alternatively, the temperature determiner 114 may be a circuit configured to determine a temperature. In some examples, the temperature determiner 114 outputs a single output signal that corresponds to the measured temperature. In some examples, the temperature determiner 114 outputs multiple output signals, each corresponding to a comparison with one or more thresholds corresponding to different temperatures, as further described below in conjunction with FIG. 2. As described above, when the temperature is low, switching devices are faster (e.g., the amount of time it takes to turn on/off the transistor with the same amount of voltage/current is faster because the carrier has higher mobility) and have lower gate oxide breakdown voltage. Accordingly, the drive strength of the condition controlled gate driver 108 should be lower when the temperature is lower to avoid voltage peaks above the lower gate oxide breakdown voltage and higher when the temperature is higher to increase the switching speed while the gate oxide breakdown voltage is higher. A circuit-based example of the temperature determiner 114 is further described below in conjunction with FIG. 2.

The process variation determiner 116 of FIG. 1 is a type of sensor that measures the variation in the manufacturing of the condition controlled gate driver 108 and/or one or more of the transistors 104, 106. Random manufacturing variations affect the switching speed of the transistor 106. For example, the gate oxide thickness of the transistor 106 will be thinner on some devices and wider on others. Devices with thinner gate oxide thickness correspond to fast switching. Additionally, there are other processing parameters that vary during manufacturing and can result in slower or faster FETs. Manufacturing variations affect both the condition controlled gate driver 108 and the driven FET (e.g., the transistor 106). For example, if the condition controlled gate driver 108 and the transistor 106 are produced on the same wafer, then the process variation may affect both in the same direction (e.g., with the condition controlled gate driver 108 and transistor 106 being twice as fast or twice as slow). Accordingly, the process variation determiner 116 may be a processor and/or a circuit producing one or more process-dependent output signals that correspond to the switching speed of the transistor 106. An example of a circuit-based process variation determiner 116 is further described below in conjunction with FIG. 2.

The condition characterizer 118 of FIG. 1 selects a desired drive strength (e.g., the ratio between an amount of current the driver conducts over a voltage at an output of the driver) for operating the example condition controlled gate driver 108. For example, the condition characterizer 118 generates one or more condition-based drive strength signals (e.g., corresponding to desired drive strengths of the condition controlled gate driver 108) based on outputs of one or more of the input voltage determiner 110, the output current determiner 112, the temperature determiner 114, and/or the process variation determiner 116 (e.g., the electrical system parameters). For example, the condition characterizer 118 may be a look-up table that generates one or more outputs (e.g., the one or more drive strength signals) based on the received value(s) of the one or more inputs. In some examples, the condition characterizer 118 may be adjustable based on the user and/or manufacture preferences. For example, if the condition characterizer 118 is being used to determine the drive strength (e.g., the ratio between an amount of current the driver conducts over a voltage at an output of the driver) for the condition controlled gate driver 108 to drive a transistor with a high gate oxide breakdown voltage, the condition characterizer 118 may transmit a signal corresponding to faster switching speeds based on the inputs. Whereas, if the condition characterizer 118 is being used to determine the drive strength for the condition controlled gate driver 108 to drive a transistor with a low gate oxide breakdown voltage, the condition characterizer 118 may transmit a signal corresponding to slower speeds based on the same inputs. For example, a user and/or manufacturer may program the condition characterizer 118 based on the specifications of the transistor that is being driven. In this manner, the condition characterizer 118 can control the drive strength of the condition controlled gate driver 108 dynamically based on any changes in input voltage, output current, temperature, and/or process variation.

Figure 2:
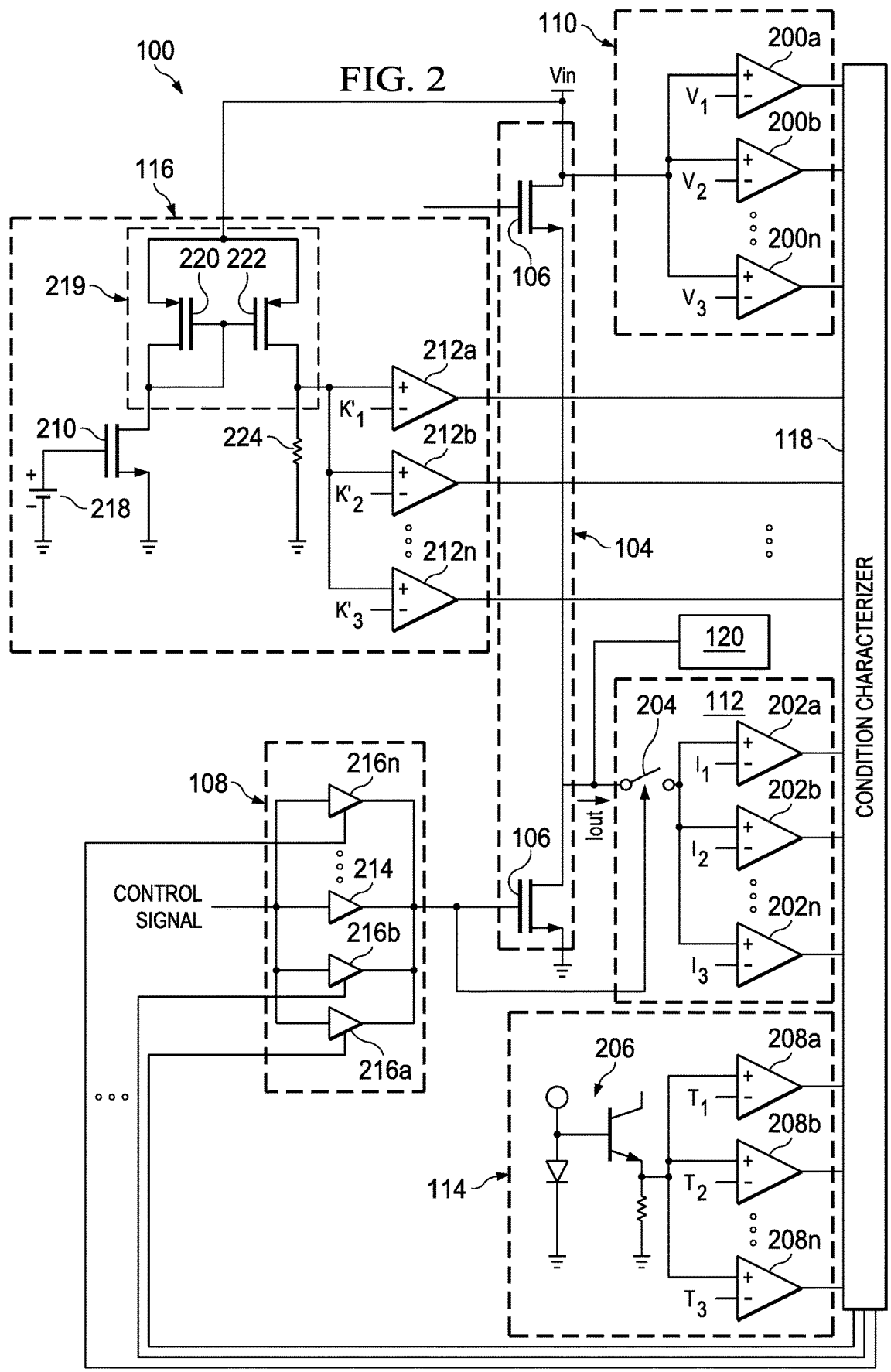
FIG. 2 is an illustration of a circuit implementation of a condition controlled gate driver, an input voltage determiner, an output current determiner, a temperature determiner, and a process variation determiner of FIG. 1.

FIG. 2 illustrates an example circuit implementation of the condition controlled gate driver 108, the input voltage determiner 110, the output current determiner 112, the temperature determiner 114, and the process variation determiner 116 of FIG. 1. The input voltage determiner 110 includes example comparators 200a-n, the output current determiner 112 includes example comparators 202a-n, the temperature determiner 114 includes an example temperature sensing circuit 206 and example comparators 208a-n, the process variation determiner 116 includes an example transistor 210 and example comparators 212a-n, and the condition controlled gate driver 108 includes drivers 214, 216a-n. Although the example of FIG. 2 illustrates particular circuit implementations of the condition controlled gate driver 108, example input voltage determiner 110, the output current determiner 112, the temperature determiner 114, the process variation determiner 116, and/or the condition characterizer 118 of FIG. 1, the condition controlled gate driver 108, example input voltage determiner 110, the output current determiner 112, the temperature determiner 114, the process variation determiner 116, and/or the condition characterizer 118 may be implemented in a different layout and/or with different components. In some examples, any one of the example comparators 200a-n, 202a-n, 208a-n, 212a-n may include hysteresis or filtering to meet specific requirements of the use condition and restrictions of the devices.

The input voltage determiner 110 of FIG. 2 includes the one or more comparators 200a-n (e.g., voltage comparators) to compare the input voltage to one or more thresholds. The output of the comparators 200a-n corresponds to some voltage range. For example, if the input voltage determiner 110 includes only two comparators 200a, 200b, and negative terminal of the first comparator 200a receives 10 Volts (V) and the negative terminal of the second comparator 200b receives 15 V, the output of the two comparators will correspond to the voltage range of the input voltage. In such an example, if the input voltage is below 10 V, both comparators 200a-b will output a low voltage, if the input voltage is between 10 V and 15 V, the first comparator 200a will output a high voltage and the second comparator 200b will output a low voltage, and if the input voltage is above 15 V, both comparators 200a, 200b will output a high voltage. In this manner, the outputs of the comparators 200a-n will be transmitted to the condition characterizer 118, thereby causing the condition characterizer 118 to output one or more control signals corresponding to the outputs of the comparators 200a-n (e.g., a higher input voltage may result in a lower drive strength). The input voltage determiner 110 may include any number of comparators 200a-n corresponding to the any number of voltage ranges.

The output current determiner 112 of FIG. 2 includes the one or more comparators 202a-n (e.g., voltage comparators) to compare the output current (e.g., a voltage corresponding to the output current) to one or more thresholds corresponding to current values. The output of the comparators 202a-n corresponds to some current range. For example, if the output current determiner 112 includes only two comparators 202a, 202b, and negative terminal of the first comparator 202a receives a voltage corresponding to 15 Amperes (A) and the negative terminal of the second comparator 202b receives a voltage corresponding to 23 A, the output of the two comparators will correspond to the current range of the output current. In such an example, if the output current is below 15 A (e.g., based on the drain to source voltage of the transistor 106 divided by the resistance of the transistor 106), both comparators 202a-b will output a low voltage, if the output current is between 15 A and 23 A, the first comparator 202a will output a high voltage and the second comparator 202b will output a low voltage, and if the output current is above 23 A, both comparators 202a, 202b will output a high voltage. In this manner, the outputs of the comparators 202a-n will be transmitted to the condition characterizer 118, thereby causing the condition characterizer 118 to output one or more control signals corresponding to the outputs of the comparators 202a-n (e.g., a higher output current may result in a lower drive strength). The output current determiner 112 may include any number of comparators 202a-n corresponding to the any number of current ranges. The output current determiner 112 further includes the switch 204. The switch 204 may be a MOSFET, for example. The switch 204 is open when the output of the condition controlled gate driver 108 is a low voltage and closed when the output of the condition controlled gate driver 108 is a high voltage. In this manner, the comparators 202a-n only compare the output current when the transistor 106 is enabled.

The temperature determiner 114 of FIG. 2 includes the temperature sensor 206 to generate a voltage corresponding to a temperature. Although the temperature sensor 206 of FIG. 2 includes a sensor, a diode, a BJT, and a resistor (e.g., to generate an amplified voltage corresponding to a temperature), other components may be utilized for the temperature sensor 206. The temperature determiner 114 of FIG. 2 includes the one or more comparators 208a-n (e.g., voltage comparators) to compare the voltage corresponding to the silicon temperature to one or more thresholds values corresponding to one or more temperatures. The output of the comparators 208a-n corresponds to some temperature range. For example, if the temperature determiner 114 includes only two comparators 208a, 208b, and negative terminal of the first comparator 208a receives a voltage corresponding to 150° Fahrenheit (F) and the negative terminal of the second comparator 208b receives a voltage corresponding to 250° F., the output of the two comparators will correspond to the temperature range of the temperature. In such an example, if the temperature is below 150° F., both comparators 208a-b will output a low voltage, if the temperature is between 150° F. and 250° F., the first comparator 208a will output a high voltage and the second comparator 208b will output a low voltage, and if the temperature is above 250° F., both comparators 208a, 208b will output a high voltage. In this manner, the outputs of the comparators 208a-n will be transmitted to the condition characterizer 118, thereby causing the condition characterizer 118 to output one or more control signals corresponding to the outputs of the comparators 208a-n (e.g., a higher temperature may result in a higher drive strength). The temperature determiner 114 may include any number of comparators 208a-n corresponding to the any number of temperature ranges.

The process variation determiner 116 of FIG. 2 includes the transistor 210, the comparators 212a-n, the voltage source 218, the transistors 220, 222, and the resistor 224 to generate an output corresponding to process variation. The transistor 210 is a NMOS transistor and the transistors 220, 222 are PMOS transistors. The voltage source 218 may be fixed or adjustable based on temperature or other parameters. The transistors 210, 220, 222 are physically smaller than transistors 104, 106. In this manner the current through transistors 210, 220, 222 is much less than the operating current of transistors 104, 106, thereby conserving system power. For example, transistor 106 may have an effective channel width of 1,000,000 microns while the transistors 210, 220, 222 may have an effective channel width of 10 microns.

The voltage source 218 of FIG. 2 outputs a predetermined voltage to the gate-source of the transistor 210, thereby enabling the transistor 210 to cause current to flow in the drains of transistors 210, 220. The transistors 220, 222 form the current mirror 219. Accordingly, the drain current of transistor 222 is equal to the drain current of transistor 220. When manufacture/process variation cause the transistor 210 to be stronger, a larger drain current is produced, resulting in higher current in transistor 222 and a higher voltage drop across resistor 224. The voltage across the resistor 224 is applied to comparators 212a-n, thereby generating a digital representation of the driver strength of the manufacturing process. Accordingly, the comparators 212a-n are voltage comparators to compare a voltage corresponding to the drain current of the transistor 210 to a voltage corresponding to a process strength (e.g., K' with units microamps per volts squared, which represents the relationship between transistor output current and transistor gate-source voltage). The output of the comparators 212a-n corresponds to some process-dependent output range. For example, if the process variation determiner 116 includes only two comparators 212a, 212b, and negative terminal of the first comparator 212a receives 50 uA/V² (microamps per volt squared) and the negative terminal of the second comparator 212b receives 70 uA/V², the output of the two comparators will correspond to the process-dependent output range corresponding to the process variation of the transistor 106 and/or the condition controlled gate driver 108. In such an example, if the output current represents a level below 50 uA/V², both comparators 212a-b will output a low voltage, if the output current represents a level above 50 uA/V² and below 70 uA/V², the first comparator 212a will output a high voltage and the second comparator 212b will output a low voltage, and if the output current represents a level above 70 uA/V², both comparators 212a, 212b will output a high voltage. In this manner, the outputs of the comparators 212a-n will be transmitted to the condition characterizer 118, thereby causing the condition characterizer 118 to output one or more control signals corresponding to the outputs of the comparators 212a-n (e.g., a drive strength corresponding to the process-dependent output). The process variation determiner 116 may include any number of comparators 212a-n corresponding to the any number of current ranges.

The condition controlled gate driver 108 of FIG. 2 includes the driver 214, 216a-n. The driver 214 corresponds to the minimum amount of drive strength that may be output by the condition controlled gate driver 108. When the control signal goes high, the driver 214 outputs a voltage/current corresponding to a drive strength to enable the transistor 106 at a switching speed corresponding to the drive strength. The drivers 216a-n are enabled dynamically to increase the drive strength of the condition controlled gate driver 108 (e.g., by increasing the amount of current output by the driver 108). For example, as described above, when the condition characterizer 118 receives the outputs of the input voltage determiner 110, the output current determiner 112, the temperature determiner 114, and/or the process variation determiner 116, the condition characterizer 118 outputs one or more control signals corresponding to a drive strength. In such an example, if the one or more control signals correspond to a minimal drive strength, the one or more control signals will be applied to the enable terminals of the drivers 216a-n to disable the drivers 216a-n. If the one or more control signals correspond to a maximum drive strength, the one or more control signals will be applied to the enable terminals of the drivers 216a-n to enable the drivers 216a-n thereby increasing the driver strength at the output of the driver 108 (e.g., by increasing the amount of current at the output of the driver 108). Additionally or alternatively, the condition characterizer 118 may output one or more control signals to enable some of the drivers 216a-n and disable some of the drivers 216a-n corresponding to some amount of drive strength. The condition controlled gate driver 108 may include any number of drivers 216a-n corresponding to the any number of drive strengths.

While an example manner of implementing the adaptive gate drive circuit 100 of FIGS. 1 and/or 2 is illustrated in FIGS. 1 and/or 2, one or more of the elements, processes and/or devices illustrated in FIGS. 1 and 2 may be combined, divided, re-arranged, omitted, eliminated and/or implemented in any other way. Further, the condition controlled gate driver 108, example input voltage determiner 110, the output current determiner 112, the temperature determiner 114, the process variation determiner 116, and/or the condition characterizer 118, and/or, more generally, the adaptive gate drive circuit 100 of FIGS. 1 and/or 2 may be implemented by hardware, software, firmware and/or any combination of hardware, software and/or firmware. Thus, for example, any of the condition controlled gate driver 108, example input voltage determiner 110, the output current determiner 112, the temperature determiner 114, the process variation determiner 116, and/or the condition characterizer 118, and/or, more generally, the adaptive gate drive circuit 100 of FIGS. 1 and/or 2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the condition controlled gate driver 108, example input voltage determiner 110, the output current determiner 112, the temperature determiner 114, the process variation determiner 116, and/or the condition characterizer 118, and/or, more generally, the adaptive gate drive circuit 100 of FIGS. 1 and/or 2 is/are hereby expressly defined to include a non-transitory computer readable storage device or storage disk such as a memory, a digital versatile disk (DVD), a compact disk (CD), a Blu-ray disk, etc. including the software and/or firmware. Further still, the adaptive gate drive circuit 100 of FIGS. 1 and/or 2 may include one or more elements, processes and/or devices in addition to, or instead of, those illustrated in FIGS. 1 and/or 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
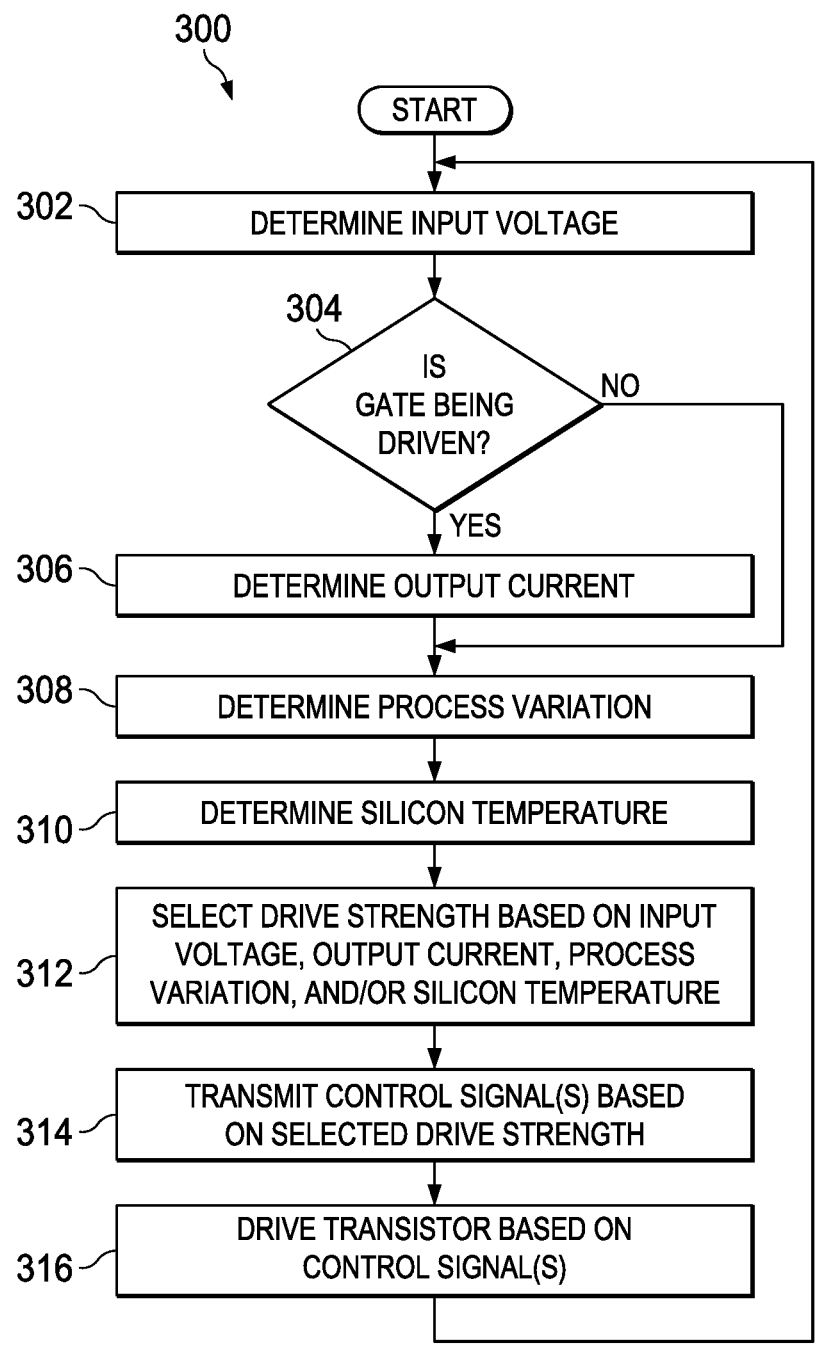
FIG. 3 is a flowchart representative of example machine readable instructions that may be executed to implement the condition controlled gate driver, the input voltage determiner, the output current determiner, the temperature determiner, and the process variation determiner of FIG. 1.

A flowchart representative of example hardware logic or machine readable instructions for implementing the adaptive gate drive circuit 100 of FIGS. 1 and/or 2 is shown in FIG. 3. The machine readable instructions may be a program or portion of a program for execution by a processor such as the processor 512 shown in the example processor platform 500 discussed below in connection with FIG. 5. The program may be embodied in software stored on a non-transitory computer readable storage medium such as a CD-ROM, a floppy disk, a hard drive, a DVD, a Blu-ray disk, or a memory associated with the processor 512, but the entire program and/or parts thereof could alternatively be executed by a device other than the processor 512 and/or embodied in firmware or dedicated hardware. Further, although the example program is described with reference to the flowchart illustrated in FIG. 3, many other methods of implementing the adaptive gate drive circuit 100 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIG. 3 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B with C.

FIG. 3 is an example flowchart 300 representative of example machine readable instructions that may be executed by the condition controlled gate driver 108, the input voltage determiner 110, the output current determiner 112, the temperature determiner 114, and/or the process variation determiner 116 of FIGS. 1 and/or 2 to provide an adaptive gate driver for switching devices (e.g., the transistor 106 of FIG. 1). Although the example flowchart 300 of FIG. 3 is described in conjunction with the transistor 106 of the power stage 102 of FIG. 1, the flowchart 300 may be used in conjunction with any switching device (e.g., power switch).

At block 302, the input voltage determiner 110 determines the input voltage of the power stage 102. As described above, the input voltage corresponds to a switching speed and/or a voltage spike magnitude. Accordingly, the input voltage determiner 110 determines the input voltage to adjust the drive strength of the condition controlled gate driver 108 to balance switching speed with the voltage spike based on the gate oxide breakdown voltage of the transistor 106.

At block 304, the output current determiner 112 determines if the gate of the transistor 106 is currently being driven (e.g., based on whether the output of the condition controlled gate driver 108 is a high voltage). For example, the switch 204 of FIG. 2 may enable when the output of the condition controlled gate driver 108 is a high voltage. If the output current determiner 112 determines that the gate of the transistor 106 is not currently being driven (block 304: NO), the process continues to block 308. If the output current determiner 112 determines that the gate of the transistor 106 is currently being driven (block 304: YES), the output current determiner 112 determines the output current (block 306). As described above, the output current corresponds to a switching speed and/or a voltage spike magnitude. Accordingly, the output current determiner 112 determines the output current to adjust the drive strength of the condition controlled gate driver 108 to balance switching speed with the voltage spike based on the gate oxide breakdown voltage of the transistor 106.

At block 308, the process variation determiner 116 determines a process variation. For example, the process variation determiner 116 generates a process-dependent value corresponding to the process variation of the transistor 106 and/or the condition controlled gate driver 108. For example, as described above in conjunction with FIG. 2, the process variation determiner 116 sense process variation based on an applied fixed gate-source voltage and constant drain-source voltage. As described above, the process variation corresponds to a switching speed and/or a voltage spike magnitude. Accordingly, the process variation determiner 116 determines the process variation to adjust the drive strength of the condition controlled gate driver 108 to balance switching speed with the voltage spike based on the gate oxide breakdown voltage of the transistor 106.

At block 310, the temperature determiner 114 determines the silicon temperature (e.g., using a temperature sensor). In some examples, the temperature determiner 114 may estimate temperature based on a calculation or other analog, digital or computational processing of signals that affect and/or vary with silicon temperature. As described above, the temperature corresponds to a switching speed and/or a voltage spike magnitude. Accordingly, the temperature determiner 114 determines the temperature to adjust the drive strength of the condition controlled gate driver 108 to balance switching speed with the voltage spike based on the gate oxide breakdown voltage of the transistor 106. At block 312, the condition characterizer 118 selects a drive strength (e.g., the ratio between an amount of current the driver conducts over a voltage at an output of the driver) based on the input voltage, the output current, the process variation, and/or the silicon temperature. For example, the conditional characterizer 118 may operate like a look-up table to generate an output based on the values of the inputs. The selected drive strength may be predetermined (e.g., based on the characteristics of the transistor 106) and/or may be adjustable based on user and/or manufacturer preferences.

At block 314, the condition characterizer 118 transmits the one or more control signals based on the selected drive strength. In some examples, the condition characterizer 118 transmits a control signal that corresponds to a specific drive strength and the condition controlled gate driver 108 drives the transistor 106 based on the selected drive strength identified in the control signal. In some examples (e.g., such as in FIG. 2), the condition characterizer 118 outputs multiple control signals to enable and/or disable multiple drivers (e.g., via the supply terminals of the drivers 216a-n) to adjust the drive strength of the condition controlled gate driver 108. At block 316, the condition controlled gate driver 108 drives the gate of the transistor 106 with the drive strength corresponding to the received control signal(s). In this manner, the condition controlled gate driver 108 adjusts the drive strength of the condition controlled gate driver 108 dynamically to optimize the switching speed while ensuring that the corresponding voltage spike will not reach gate oxide breakdown voltage of the transistor 106. After block 316, the process is repeated to ensure that the drive strength of the condition controlled gate driver 108 adjusts based on changes to the input voltage, output current, and/or temperature. In each example, the determination of input voltage, current, temperature and/or process may be quantified into as few as one signal or a large number of signals. In some examples, an analog signal coming from the input voltage determiner 110, the output current determiner 112, the temperature determiner 114 and/or the process variation determiner 116 may cause a continuous, or substantially continuous, variation in drive strength of the condition controlled gate driver 108.

Figure 4A:
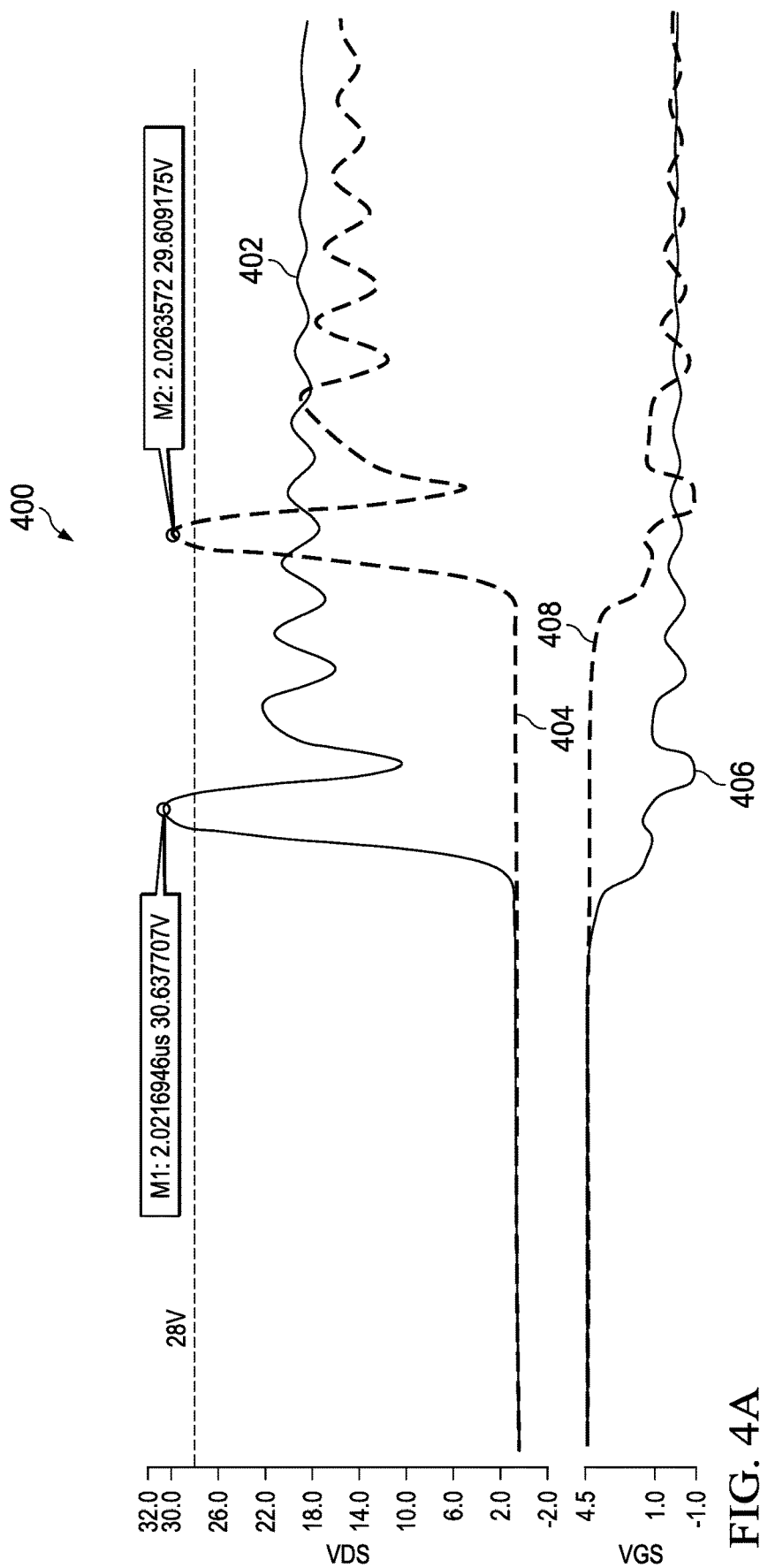
FIGS. 4A and 4B is an illustration of example timing diagrams illustrating a comparison of voltages corresponding to an example switch of FIG. 1.
Figure 4B:
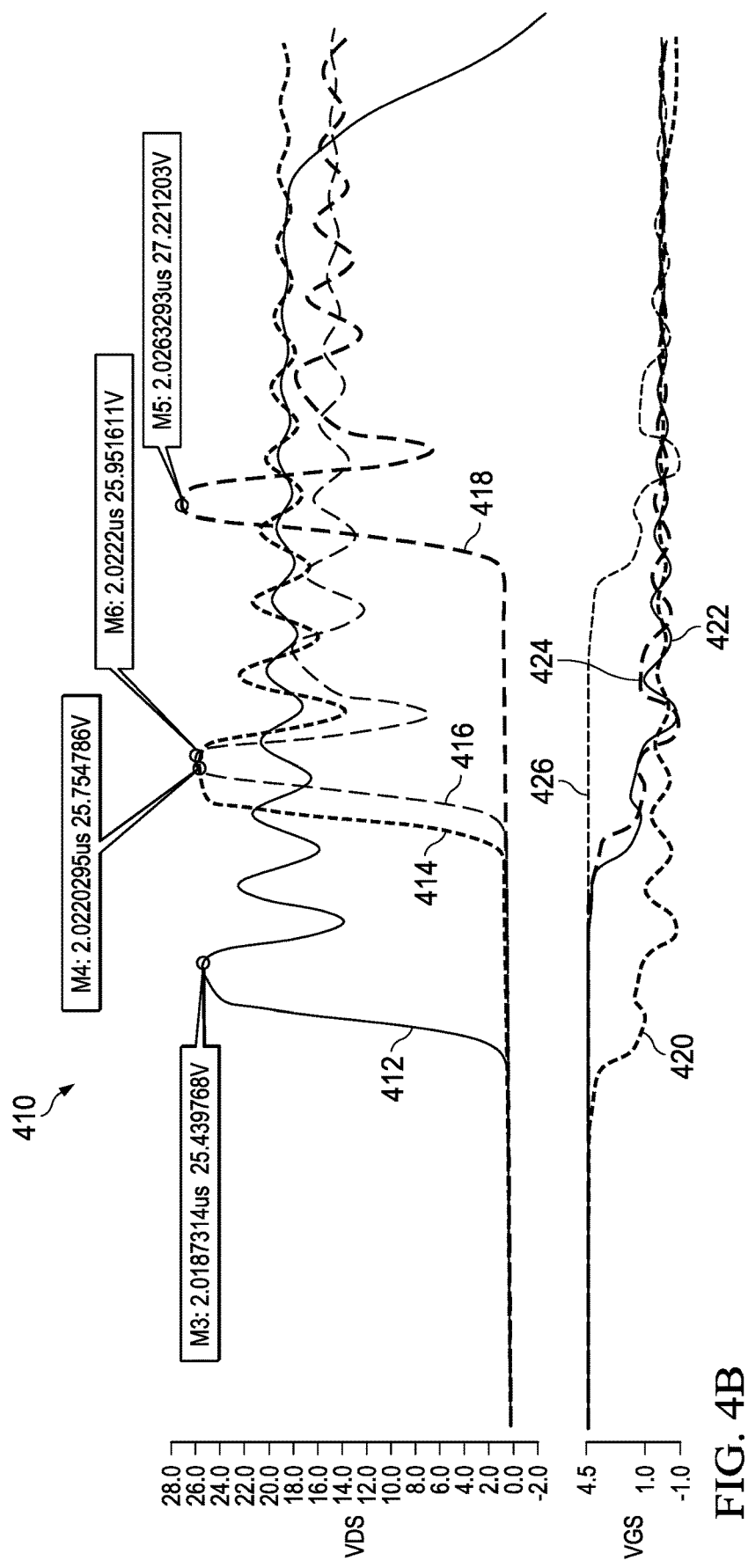

FIG. 4A illustrates a first example graph 400 corresponding to a drain-to-source voltage (VDS) and gate-to-source voltage (VGS) of a transistor that is driven with a non-condition based driver. FIG. 4B illustrates a second example graph 410 corresponding to a VDS and a VGS of the transistor 106 that is driven with the condition controlled gate driver 108 of FIG. 1. For example, FIG. 4B corresponds to the condition controlled gate driver 108 driving the transistor 106 with a drive strength that is based on at least one of input voltage, output current, temperature, and/or process variation. In the graphs 400, 410 of FIGS. 4A, 4B the maximum safe operating voltage of the transistor is 28 V.

FIG. 4A includes a first example VDS 402, a second example VDS 404, a first example VGS 406, and a second example VGS 408. For example, the first VDS 402 and the first VGS 406 may correspond to an input voltage set at 18 V and the second VDS 404 and the second VGS 408 may correspond to an input voltage at 14 V. As shown in the first example graph 400, when the first VGS 406 drops from a high voltage to a low voltage, the first VDS 402 raises to a voltage peak of 30.6 V after 2.022 microseconds. Additionally, when the second VGS 408 drops from the high voltage to the low voltage, the second VDS 402 raises to a voltage peak of 29.6 V after 2.026 microseconds. Because the gate oxide breakdown voltage of the transistor may be 28 V, driving the transistor causes a voltage peak above the gate oxide breakdown voltage, which may cause damage to the system by breaking down the gate oxide of the transistor.

FIG. 4B includes a four example VDSs 412, 414, 416, 418, and four example VGSs 420, 422, 424, 426. For example, the first VDS 412 and the first VGS 420 may correspond to an input voltage set at 12 V with an output current of 18 A. the second VDS 414 and the second VGS 422 may correspond to an input voltage at 15 V with an output current of 18 A, the third VDS 416 and the second VGS 424 may correspond to an input voltage at 12 V with an output current of 14 A, and the fourth VDS 418 and the second VGS 426 may correspond to an input voltage at 15 V with an output current of 14 A. As shown in the graph 410, when the first VGS 420 drops from a high voltage to a low voltage, the first VDS 412 raises to a voltage peak of 25.44 V after 2.019 microseconds. Additionally, when the second VGS 422 drops from the high voltage to the low voltage, the second VDS 414 raises to a voltage peak of 25.75 V after 2.022 microseconds. When the third VGS 424 drops from the high voltage to the low voltage, the third VDS 416 raises to a voltage peak of 25.95 V after 2.022 microseconds. When the fourth VGS 426 drops from the high voltage to the low voltage, the fourth VDS 418 raises to a voltage peak of 27.22 V after 2.026 microseconds. Because the gate oxide breakdown voltage of the transistor may be 28 V, driving the transistor 106 with the condition controlled gate driver 108 does not causes a voltage peak above the gate oxide breakdown voltage.

Figure 5:
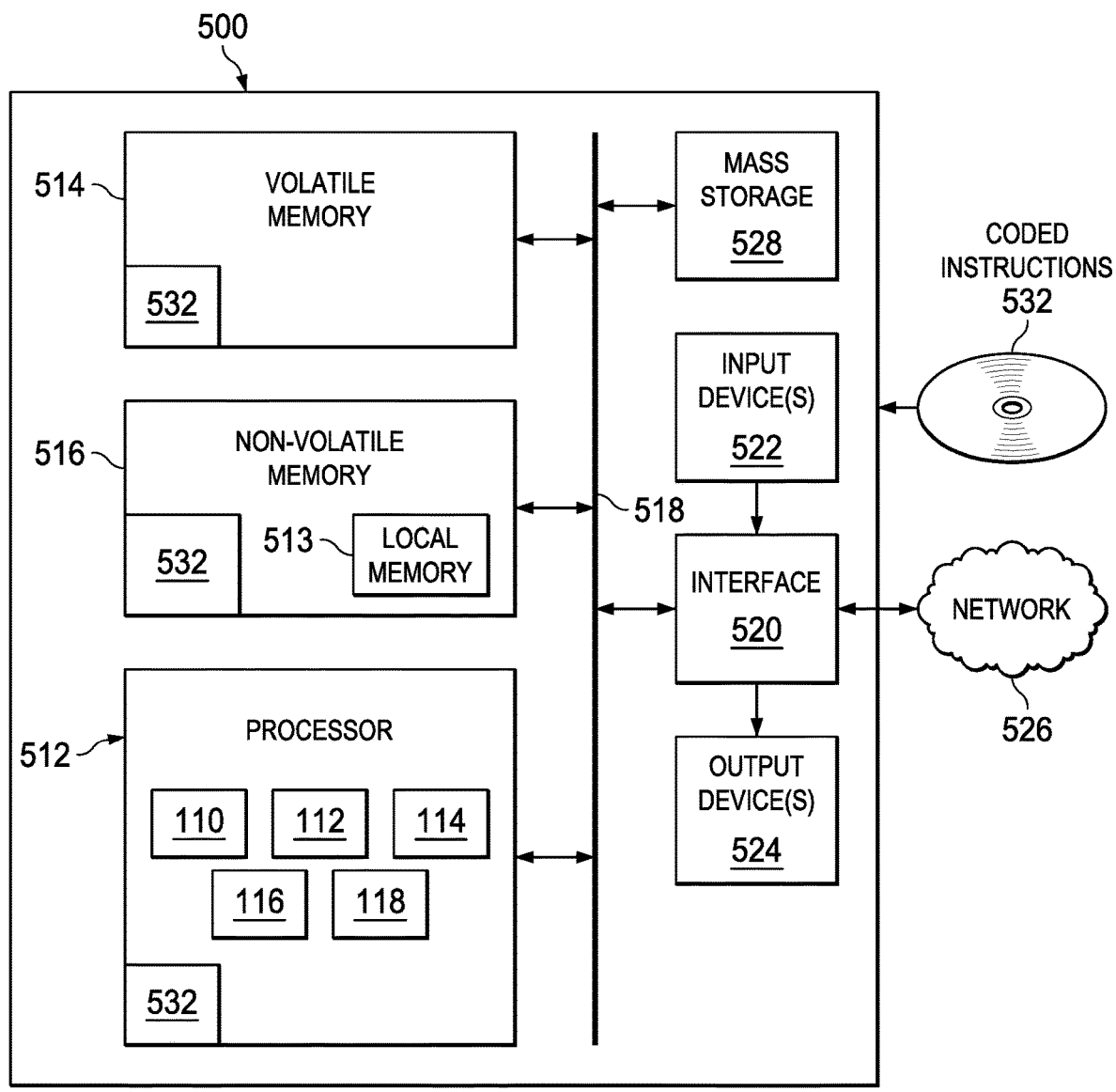
FIG. 5 is an example processor platform that may execute the example computer readable instructions of FIG. 3 to implement the condition controlled gate driver, the input voltage determiner, the output current determiner, the temperature determiner, and the process variation determiner of FIG. 1.

FIG. 5 is a block diagram of an example processor platform 500 structured to execute the instructions of FIG. 3 to implement the adaptive gate drive circuit 100 of FIGS. 1 and/or 2. The processor platform 500 can be, for example, a microcontroller, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 500 of the illustrated example includes a processor 512. The processor 512 of the illustrated example is hardware. For example, the processor 512 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the condition controlled gate driver 108, example input voltage determiner 110, the output current determiner 112, the temperature determiner 114, the process variation determiner 116, and/or the condition characterizer 118.

The processor 512 of the illustrated example includes a local memory 513 (e.g., a cache). The processor 512 of the illustrated example is in communication with a main memory including a volatile memory 514 and a non-volatile memory 516 via a bus 518. The volatile memory 514 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 516 may be implemented by flash memory and/or any other desired type of memory device. Access to the main memory 514, 516 is controlled by a memory controller.

The processor platform 500 of the illustrated example also includes an interface circuit 520. The interface circuit 520 may be implemented by any type of interface, such as an Ethernet interface, a universal serial bus (USB), a Bluetooth® interface, a near field communication (NFC) interface, and/or a PCI express interface.

In the illustrated example, one or more input devices 522 are connected to the interface circuit 520. The input device(s) 522 permit(s) a user to enter data and/or commands into the processor 512. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 524 are also connected to the interface circuit 520 of the illustrated example. The output devices 524 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 520 of the illustrated example, thus, typically includes a graphics driver card, a graphics driver chip and/or a graphics driver processor.

The interface circuit 520 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 526. The communication can be via, for example, an Ethernet connection, a digital subscriber line (DSL) connection, a telephone line connection, a coaxial cable system, a satellite system, a line-of-site wireless system, a cellular telephone system, etc.

The processor platform 500 of the illustrated example also includes one or more mass storage devices 528 for storing software and/or data. Examples of such mass storage devices 528 include floppy disk drives, hard drive disks, compact disk drives, Blu-ray disk drives, redundant array of independent disks (RAID) systems, and digital versatile disk (DVD) drives.

The machine executable instructions 532 of FIG. 3 may be stored in the mass storage device 528, in the volatile memory 514, in the non-volatile memory 516, and/or on a removable non-transitory computer readable storage medium such as a CD or DVD.

From the foregoing, it will be appreciated that example methods, apparatus and articles of manufacture have been disclosed that provide an adaptive gate driver for switching devices. Examples disclosed herein provide a driver that is controlled to adjust drive strength dynamically to increase the switching speed of a power switch while ensuring that a voltage peak caused by the driving of the switch does not reach the gate oxide breakdown voltage of the voltage peak. In this manner, a driver can optimize switching speed based on a variety of factors to increase the efficiency of a power converter while avoiding a gate oxide breakdown voltage.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:
1. An apparatus comprising:
  a first transistor having a first control terminal and first and second current terminals;
  a process variation determiner including:
    a second transistor having a second control terminal and third and fourth current terminals, the second control terminal coupled to a fixed positive voltage terminal, and the third current terminal coupled to a ground terminal;
    a current mirror having a current mirror input and a current mirror output, the current mirror input coupled to the fourth current terminal, the current mirror configured to provide a current mirror signal at the current mirror output that is indicative of a gate oxide thickness of the first transistor;
    a first comparator having a first comparator output and first and second comparator inputs, the first comparator input coupled to the current mirror output, and the second comparator input coupled to a first reference voltage; and
    a second comparator having a second comparator output and third and fourth comparator inputs, the third comparator input coupled to the current mirror output, and the fourth comparator input coupled to a second reference voltage;
  a condition characterizer having first and second characterizer inputs and a characterizer output, the first characterizer input coupled to the first comparator output, and the second characterizer input coupled to the second comparator output, the condition characterizer configured to provide a drive strength signal at the characterizer output responsive to the first and second characterizer inputs; and
  a driver having a driver input and a driver output, the driver input coupled to the characterizer output, and the driver output coupled to the first control terminal, the driver configured to provide a current at the driver output responsive to the driver input.

2. The apparatus of claim 1, wherein the condition characterizer is configured to select the drive strength signal responsive to a system parameter corresponding to an electrical system, the system parameter including at least one of an input voltage to the first transistor, an output current through the first transistor, or a silicon temperature.

3. The apparatus of claim 1, wherein the condition characterizer is configured to select the drive strength responsive to a switching speed and a gate oxide breakdown voltage of the first transistor.

4. The apparatus of claim 1, wherein the driver is configured to adjust the drive strength responsive to a control signal from the condition characterizer.

5. The apparatus of claim 1, wherein the first transistor is at least one of a power switch, a transistor, a power transistor, or a relay.

6. The apparatus of claim 1, wherein the first transistor is configured to control a flow of current in an electrical system.

7. The apparatus of claim 1, wherein the process variation determiner is to determine the gate oxide thickness responsive to an applied fixed gate-source voltage and a constant drain-source voltage.

8. The apparatus of claim 1, wherein the process variation determiner includes a voltage source to provide a fixed positive voltage at the fixed positive voltage terminal.

9. A method comprising:
  determining a value representative of a gate oxide thickness of an electrical switch in an electrical system by:
    inducing a current through a transistor by coupling a control terminal of the transistor to a constant positive voltage source;
    connecting a first current terminal of the transistor to ground, and connecting a second current terminal of the transistor to a current mirror having a current mirror output terminal;
    connecting respective input terminals of comparators to the current mirror output terminal, wherein each respective comparator corresponds to a range of current through the transistor;
    correlating the range of current through the transistor to a gate oxide thickness value;
  selecting a drive strength responsive to the gate oxide thickness value; and
  providing an output signal having a current corresponding to the selected drive strength.

10. The method of claim 9, further including sensing a system parameter of the electrical system, the selecting of the drive strength being responsive to the system parameter, the system parameter including at least one of an input voltage corresponding to the electrical switch, an output current corresponding to the electrical switch, or a silicon temperature.

11. The method of claim 9, wherein the selecting of the drive strength is responsive to a switching speed and a gate oxide breakdown voltage of the electrical switch.

12. The method of claim 9, including adjusting the drive strength of a driver based on a control signal.

13. The method of claim 9, wherein the electrical switch is at least one of a power switch, a transistor, a power transistor, or a relay.

14. The method of claim 9, wherein driving the electrical switch controls a flow of current in the electrical system.

15. An apparatus comprising:
  a first sensor, the first sensor including:
    a driver circuit having a driver input and a driver output;

a first switch having a control terminal and first and second current terminals, the control terminal coupled to the driver output, and the second current terminal coupled to a ground terminal;

a second switch having first, second and third sensor terminals, the first sensor terminal coupled to the first current terminal, and the second sensor terminal coupled to the control terminal of the first switch;

a first comparator having a first comparator output and first and second comparator inputs, the first comparator input coupled to the third sensor terminal, and the second comparator input coupled to a first reference voltage terminal;

a second comparator having a second comparator output and third and fourth comparator inputs, the third comparator input coupled to the first comparator input, and the fourth comparator input coupled to a second reference voltage terminal;

a processor having first and second processor inputs and a processor output, the first and second processor inputs coupled to the first and second comparator outputs, respectively, and the processor output coupled to the driver input; and a second sensor, the second sensor including:

a transistor having a transistor control terminal and first and second transistor current terminals;

a non-zero voltage source coupled to the transistor control terminal;

a current mirror having a current mirror input and a current mirror output, the current mirror input being coupled to the first transistor current terminal, and the current mirror output coupled to a resistor;

a third comparator having a third comparator output and fifth and sixth comparator inputs, the fifth comparator input coupled to the current mirror output, the sixth comparator input coupled to a first process reference voltage terminal, and the third comparator output coupled to a third processor input; and a fourth comparator having a fourth comparator output and seventh and eighth comparator inputs, the seventh comparator input coupled to the current mirror output, the eighth comparator input coupled to a second process reference voltage terminal, and the fourth comparator output coupled to a fourth processor input.

16. The apparatus of claim 15, wherein the driver circuit includes a plurality of drivers configured to receive a control signal, each driver having an output coupled to the output of the driver circuit.

17. The apparatus of claim 16, wherein the processor is coupled to activation terminals of the drivers.

18. The apparatus of claim 15, wherein the processor is implemented by one or more of the following: integrated circuits, logic circuits, microprocessors, GPUs, DSPs, and controllers.

19. The apparatus of claim 15, further including:

a temperature sensor having a temperature sensor output;

a third comparator having a third comparator output and fifth and sixth comparator inputs, the fifth comparator input coupled to the temperature sensor output, the sixth comparator input coupled to a first temperature reference voltage terminal, and the third comparator output coupled to a third processor input; and a fourth comparator having a fourth comparator output and seventh and eighth comparator inputs, the seventh comparator input coupled to the temperature sensor output, the eighth comparator input coupled to a second temperature reference voltage terminal, and the fourth comparator output coupled to a fourth processor input.

* * * * *